United States Patent [19]

Gervais et al.

[11] Patent Number: 5,493,212

[45] Date of Patent: Feb. 20, 1996

[54] ELECTRICITY METER WITH VARIABLE GAIN SIGMA-DELTA CONVERTER

[75] Inventors: Michel Gervais, Champigny sur Marne; Alain Bazin, Villejuif; Denise Schang, Montrouge, all of France

[73] Assignee: Schlumberger Industries, S.A., Montrouge, France

[21] Appl. No.: 446,965

[22] Filed: May 22, 1995

Related U.S. Application Data

[63] Continuation of Ser. No. 182,908, Jan. 13, 1994, abandoned.

[30] Foreign Application Priority Data

Jan. 20, 1993 [EP] European Pat. Off. .............. 93400129

[51] Int. Cl.[6] .............................. H03M 3/02; H03M 1/12
[52] U.S. Cl. ............................................. 324/142; 341/143
[58] Field of Search ...................... 341/166, 133, 341/143, 127, 145, 61, 175, 143; 324/142, 140, 141, 117 H, 117 R, 120, 121

[56] References Cited

U.S. PATENT DOCUMENTS 4,081,800   3/1978   Anemiya et al. ...................... 340/347
5,245,343   9/1993   Greenwood et al. .................. 341/143

*Primary Examiner*—Kenneth A. Wieder
*Assistant Examiner*—Barry C. Bowser
*Attorney, Agent, or Firm*—Sanford J. Asman

[57] ABSTRACT

An electricity metering device including at least one sigma-delta converter (20) adapted to output a series of digital pulses, a digital counter means (21) for summing the output of the sigma-delta converter and a signalling means (32) to deliver an output signal (38) when the sum reaches a predetermined value, characterized in that the metering device further comprises a means (32, 33) for digitally adjusting the gain of the sigma-delta converter comprising programmable digital memory means (33) adapted to store a parameter representing the gain of the metering device, the value of the parameter being externally programmable, and a digital logic means (32) for logically combining the gain parameter with the digital sum stored in the counter means to determine the number of pulses required before the predetermined value is reached and an output pulse delivered.

15 Claims, 3 Drawing Sheets

ELECTRICITY METER WITH VARIABLE GAIN SIGMA-DELTA CONVERTER

This application is a continuation of application Ser. No. 08/182,908, filed on Jan. 13, 1994, now abandoned, entitled ELECTRICITY METER WITH VARIABLE GAIN SIGMA-DELTA CONVERTER.

The present invention relates to an electricity metering device including at least one sigma-delta converter adapted to output a series of digital pulses, a digital counter means for summing the output of the sigma-delta converter and a signalling means to deliver an output signal when the sum reaches a predetermined value.

Sigma-delta converters are well-known analogue to digital converters, in which an analogue input voltage is summed with a larger reference voltage, the sum being integrated and the running total of the integrator being fed to a clocked comparator which produces a positive or negative output depending on the results of the comparison. The positive or negative output of the comparator is fed back to control the polarity of the reference voltage, the polarity being controlled to tend to bring the charge in the integrator towards zero. The clocked output of the comparator over a period of time is thus a series of digital pulses of +1 or −1, in which the magnitude of the input voltage is represented by the difference between the number of positive comparator output pulses and the number of negative comparator output pulses, i.e. $N^+-N^-$. The series of output of pulses of the sigma-delta converter may then be summed, by an integrator or by an up/down counter, in order to arrive at the digital value corresponding to the input voltage. Combined sigma-delta devices are also known (see FR 2 570 854) in which a first signal is fed to a first sigma-delta converter and a second signal to a second sigma-delta converter, the polarity of the second input signal being controlled according to the pulsed output of the first sigma-delta converter. The output of the second sigma-delta converter then represents the product of the first and second signals.

Such sigma-delta circuits find a particular application in the field of the electricity metering, where the voltage of the power supply and/or the value of current taken, as represented by a voltage across a shunt for example, may be converted into digital signals. The combination sigma-delta converter discussed above is particularly useful in metering systems as voltage and current signals may be fed to the first and second converters respectively, the output of the second converter representing the product of the signals, i.e. the energy being taken.

In the field of electricity metering problems arise particularly related to the accuracy of the components used to sample the voltage and current values. For example, where a simple shunt is used to provide a voltage signal representative of the current, errors may arise associated with the exact value of the resistance used in the shunt, the variation of this resistance with temperature etc. Similar errors can arise in the measurement of the supply voltage due to component inaccuracies in the voltage divider used to sample the voltage. These inaccuracies will be multiplied when the power or energy of the supply is measured and quite significant errors can result from this combination, together with any further deviations introduced by variations in the components used in the multiplier.

In order to overcome such errors, previous methods of calibrating meters have concentrated on adjusting or trimming the components used, for example, by setting the value of a variable resistance shunt during a precalibration phase. Such precalibration tends to be time-consuming and expensive as each meter has to be tested and components manually re-adjusted or replaced.

The present invention is characterized in that the metering device further comprises a means for digitally adjusting the gain of the sigma-delta converter comprising a programmable digital memory means adapted to store a parameter representing the gain of the metering device, the value of the parameter being externally programmable, and a digital logic means for logically combining the gain parameter with the digital sum stored in the counter means to determine the number of pulses required before the predetermined value is reached and an output pulse delivered.

Thus, any variations in meter performance due to component inaccuracies can be quickly and easily compensated for during a calibration stage by merely reprogramming the gain parameter to an appropriate value which gives the desired readings. The programmable memory means may be a non-volatile memory and may comprise a simple shift register which stores a digital value representing the gain. Once set, the gain of the meter will be fixed unless reprogramming is required at any time during the life of the meter. The present invention also gives rise to the advantage that a basic meter design including fixed values of components may be used in a variety of applications to measure a wide range of current and voltage values through selection of the desired values of gain of the meter.

In a metering device including a plurality of sigma-delta converters, the gain of each converter may be adjustable by means of an associated programmable memory means and logic means as described above. The invention further extends to a metering device comprising a combination of sigma-delta devices operating to give a value representative of the multiplication of the input signals and in which the gain of the final sigma-delta converter of the combination which produces an output representative of the energy or power of the metered supply is adjustable by means of an associated programmable digital memory means and logic means.

The output signal from the signalling means may further be supplied to an additional counter means to control a meter output display.

In one embodiment, the counter means and signalling means comprise a counter adapted to give an output signal when the counter reaches a fixed predetermined value (such as its maximum value) and in which the gain parameter is a numerical value added by the logic means to the counter in addition to the pulses from the sigma-delta converter.

As discussed above, the value of an input signal to the sigma-delta converter is represented by the difference between the number of up and down pulses from the converter, i.e. $N^+-N^-$. The counter counts the number of positive pulses (or negative) or the difference between the two, rather than the ratio between the two. Simple addition of a numerical value will thus have a linear effect on the gain of the converter for all magnitudes of input signals.

Alternatively, the logic means and signalling means may comprise a comparator adapted to compare the value of the gain parameter with the value of the sum in the counter means and to deliver an output signal when the two values are equal. Again, the number of positive or negative pulses represents directly the magnitude of the input signal and changing the value of the gain parameter to change the count at which an output signal is delivered will give rise to a linear change in gain across all magnitudes of the input signal.

The digital counter means for summing the sigma-delta pulses may comprise any suitable counter, such as a simple up counter, in which the sum in the counter represents the number of up pulses only, an up-down binary counter, a counter operating in a non-binary base etc.

Depending on the details of the sigma-delta converter used, the overall polarity of pulses output from the sigma-delta converter may reflect the overall polarity of the input signal or signals (either directly or inversely) such that, in some instances, the majority of pulses supplied will be positive whilst, in other instances, the pulses supplied will be largely negative. The output of the sigma-delta will then switch from a majority of positive pulses to a majority of negative pulses, according to the mode of operation. This will affect the operation of the counter which, typically, comprises a simple up-down binary counter which can count up from a value 000 . . . 000 to 111 . . . 111 or down from a value 111 . . . 111 to 000 . . . 000 depending on the polarity of the pulses.

The invention may then further comprise means for compensating for the polarity of pulses from the sigma-delta converter. For example, in the embodiment in which the numerical sum of the counter is compared directly with the gain parameter, the counter may comprise a binary up-down counter and the device may further comprise means for supplying the binary complement of the gain parameter to the comparator. For example, consider the case of a 3 bit binary counter capable of counting up from 000 to 111 or down from 111 to 000. If the gain parameter is set to 101 for a positive count, it will take 5 positive pulses for the counter to reach 101 from 000 and for the comparator to output a signal. In the alternative direction of the count, where mainly negative pulses are output, the complement of 101 is supplied, that is 010. In such operation, the counter will start from 111 and, again, it will take 5 negative pulses to reach 010 from 111.

There will now be described, by way of example only, preferred embodiments of the present invention, with reference to the accompanying drawings, in which.

Figure 1:
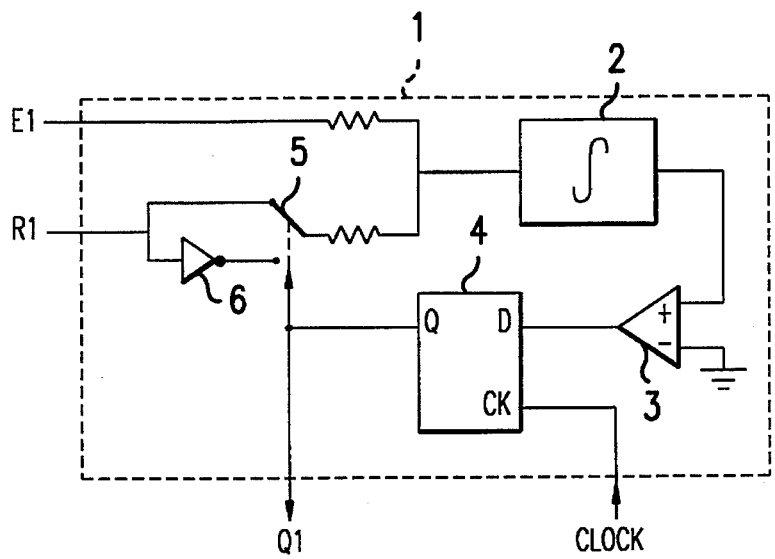
FIG. 1 shows a conventional sigma-delta device for converting an analogue signal into a digital form.

Referring to FIG. 1, a sigma-delta converter 1 is shown, comprising an integrator 2, a comparator 3, a bistable 4 and a switch 5 and inverter 6. An input signal E1 is fed to the integrator 2, summed with a reference signal R1, the polarity of the reference R1 being determined by the switch 5 and inverter 6, as controlled by the output Q from the bistable 4. The reference signal R1 is chosen to have a magnitude greater than the maximum value of E1. The output Q, and the polarity of the reference signal R1 is determined by the comparator 3. The comparator and inverter act to minimise the charge in the integrator, that is, to tend to bring the charge in the integrator towards zero. The bistable 4 acts to change the polarity of R1 with each interval of a CLOCK signal. After N clock signals, the reference voltage will have been applied $N^+$ times with a positive polarity and $N^-$ times with a negative polarity. If N is large enough the charge stored in the integrator will tend to zero, such that:

$$N \int^t E1.dt + (N^+ - N^-) \int^t R1.dt = 0$$

where t is the duration of each clock time interval and the integrated values of E1 and R1 represent the corresponding charge stored at each clock interval.

Thus:

$$N^+ - N^- = -\frac{N \cdot E1}{R1}$$

such that the difference between the number of positive pulses applied and the number of negative pulses is proportional to the magnitude of the input signal. This information is available in the output Q1 from the sigma-delta converter.

Figure 2:
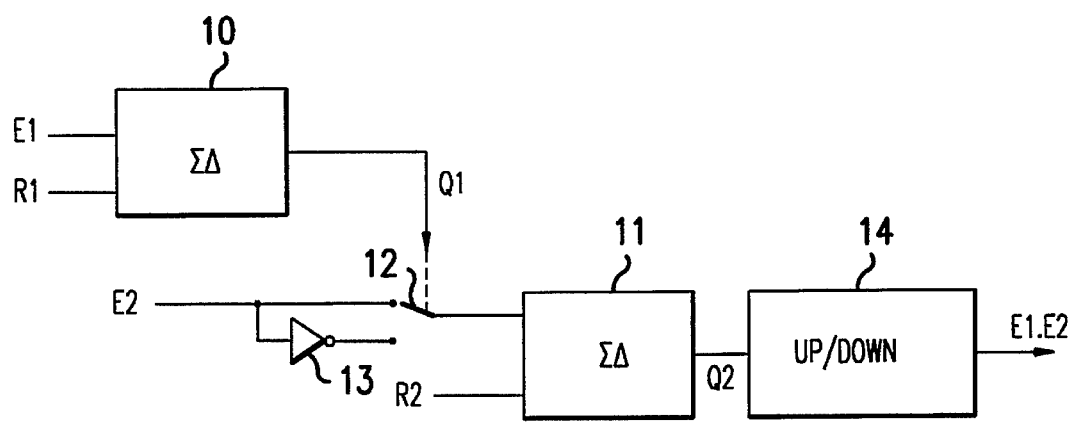
FIG. 2 shows a combined sigma-delta device for turning the analogue signals into digital value representative of the product of those signals.

Referring to FIG. 2, a combined sigma-delta converter circuit is shown comprising a first sigma-delta converter 10 fed with a first input signal E1 and reference signal R1 and a second sigma-delta converter 11 fed with a second input signal E2 and reference R2. The structure of each converter is the same as that shown in FIG. 1. The output Q1 additionally controls the polarity of the input signal E2 via a switch 12 and inverter 13, according to whether a positive or negative pulse is output on the line Q1. At the end of a time interval N, the sigma-delta 10 will have output $N1^+$ positive signals and $N1^-$ negative signals, such that a signal E2 will have been applied N2+ times and a signal −E2 will have been applied $N1^-$ times to the converter 11. Accordingly, in the same manner as for a single converter, for the converter 11:

$$N.E2.(N1^+ - N1^-) + (N2^+ - N2^-).R2 = 0$$

where $N2^+$ and $N2^-$ are the number of times the reference R2 has been applied, as controlled by the output Q2 of converter 11.

However, for the first converter 10:

$$N1^+ - N1^- = -\frac{N \cdot E1}{R1}$$

such that:

$$-\frac{N^2}{R1} \cdot E1 \cdot E2 + (N2^+ - N2^-) \cdot R2 = 0$$

and:

$$N2^+ - N2^- = A \cdot E1 \cdot E2 \quad \text{where } A = \frac{N^2}{R1 \cdot R2}$$

Accordingly, the difference $N2^+ - N2^-$ as represented by the output Q2 will be proportional to the product of the input signals. This circuit is particularly useful in the field of electricity metering where the inputs E1 and E2 are the voltage and current, the circuit giving a value representative of the energy of the metered supply. Conventionally, the output from the combined sigma-delta arrangement is fed to an integrator or up-down counter 14 the running total of which is increased by each positive pulse or decremented by each negative pulse to give a running total corresponding to the energy consumed.

As discussed in the introduction to the present application, the conventional utilisation of sigma-delta circuits in electricity metering applications gives rise to a number of problems of accurate calibration of the meter associated with variations in component values etc. Previous attempts to improve the calibration of such meters have focussed on improving the component tolerances.

Figure 3:
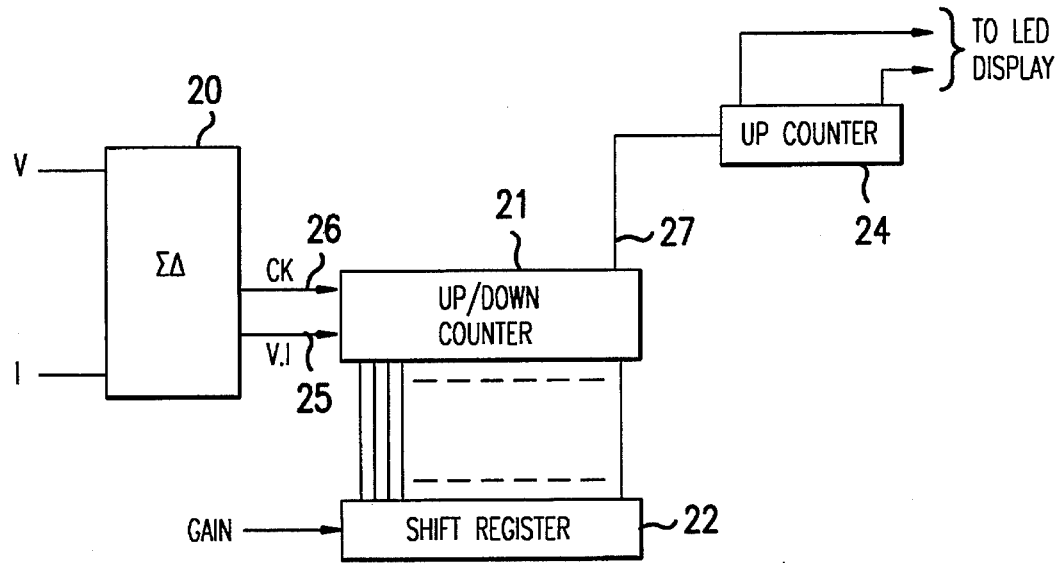
FIG. 3 shows a metering device including a combined sigma-delta circuit and a variable digital gain according to one embodiment of the invention.

Referring to FIG. 3, a metering device according to one embodiment of the invention is shown including a combined sigma-delta multiplier 20, an up-down counter 21, a shift register 22, and an up counter 24. The value of the voltage V and current I to be metered are fed to the combined sigma-delta 20 which produces at line 25 a product signal representative of the energy V.I together with a clock signal on line 26, fed to the up-down counter 21. In the simplest embodiment shown here, the product signal at line 25 comprises a stream of positive and negative pulses, each positive pulse incrementing the counter by one and each negative pulse decrementing the counter by one, but in which there are more positive pulses than negative i.e. such that $N^+$–$N^-$ will be a positive value. The sum stored in the up-down counter thus gradually accumulates until the maximum value storable in the up-down counter is reached, at which point a single positive pulse is output on line 27 to the up counter 24, and the converter is reset to zero. The up counter 24 in turn counts the number of times this occurs, representative of the difference $N^+$–$N^-$, and outputs a signal to an LED display and associated circuitry.

The circuit additionally comprises a shift register 22, for holding a numerical gain value set by a central microprocessor (not shown) delivered to the up-down counter 21. In this embodiment, the numerical gain value held in the shift register is simply added to the total in the up-down counter, such that the upward count of the counter to its maximum value will start from a non-zero point. The numerical value held in the shift register 22 may be varied to alter the gain of the device. As the magnitude of the product signal is represented by the difference between the counted number of positive and negative pulses, simple addition of a predetermined gain value to the sum stored in the counter 21 will have a linear effect on the gain of the converter over all magnitudes of input energy.

Figure 4:
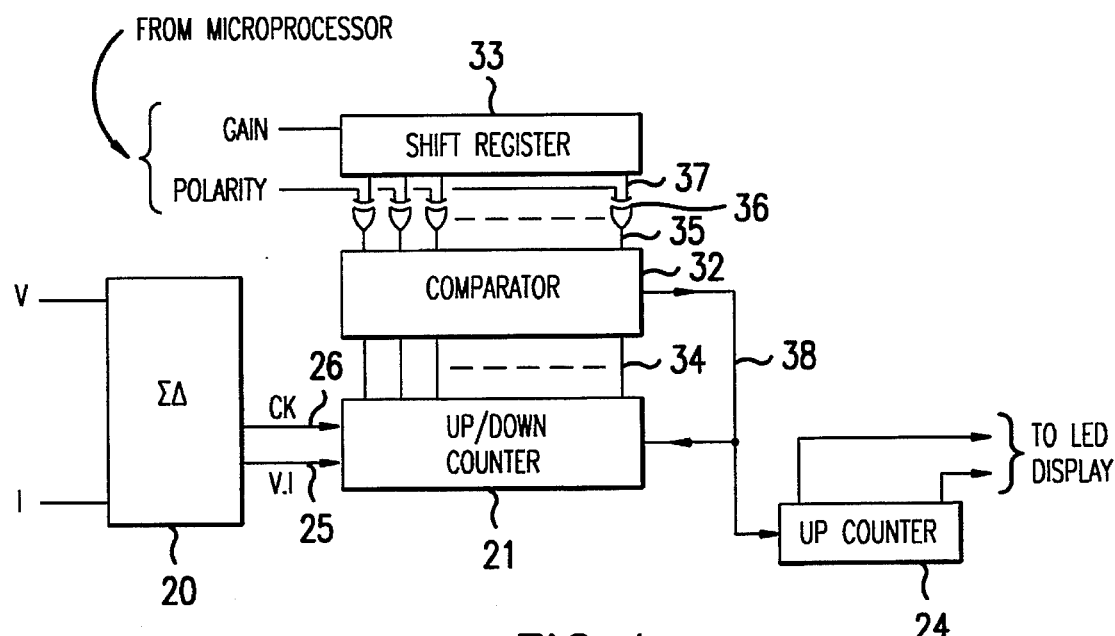
FIG. 4 shows a metering device including a combined sigma-delta circuit and variable digital gain according to a second embodiment of the invention.

An alternative embodiment is shown in FIG. 4, in which the total in the up-down counter 21 is compared by a comparator 32 with a gain value stored in a shift register 33. The binary value of the sum in the up-down counter is output on a series of lines 34, each line carrying the value 0 or 1, each line representing a digit of the binary word from the least significant bit to the most significant bit. The gain value is similarly output on a series of lines 37, each line being connected to an input of an exclusive OR gate 36, the other input being fed by a polarity signal from a central microprocessor, the output line 35 of each gate being compared by the comparator 32 with the corresponding line 34 of the up-down counter 21. The exclusive OR gates 36 function to deliver the complement of the value of the corresponding line 37 when the polarity input is set high, i.e. such that an input 11001 . . . becomes 00110 . . . .

In operation, the value of the gain parameter stored in the shift register 33 is set by a central microprocessor (not shown). If the sigma-delta converter 20 is operating in a mainly positive mode, the polarity signal is set low and the counter counts up from zero. When the comparator identifies that the sum in the up-down counter 21 has reached the value stored in the shift register 33, a signal is output on line 38 which acts to reset the counter to zero to restart the count, the number of signals at line 38 being counted by an up counter 24 as before to give an indication of power consumed to an LED display or similar device. The gain of the device may be adjusted by setting the level of the gain value in the shift register 33, such that the count will be completed at higher or lower levels.

In the event that the sigma-delta converter outputs mainly negative signals the polarity signal will be set high by the microprocessor. The overall polarity of the output pulses may be determined by the microprocessor from the output line 25 or from other parameters in the sigma-delta circuit, for example, the polarity of any modulation signal applied to the sigma-delta converter. For a simple up-down counter not having a polarity bit indicative of the polarity in the counter, a stream of negative pulses will cause the counter to switch from a starting value of 000 . . . to 111 . . . , i.e. the maximum value of the counter, each subsequent negative pulse decrementing this value. The polarity signal compensates for this change in operation by delivering the complement of the gain value for comparison by the comparator 32. For example, for a simple 3 bit counter/comparator/register arrangement, a gain value set to 101 will be reached in 5 positive steps from 000 by the counter 21. For a negative count, the polarity signal will be high and the complement 010 of the gain value will be delivered to the comparator 32 such that the counter will reach this value in 5 negative steps down from the value 111.

Figure 5:
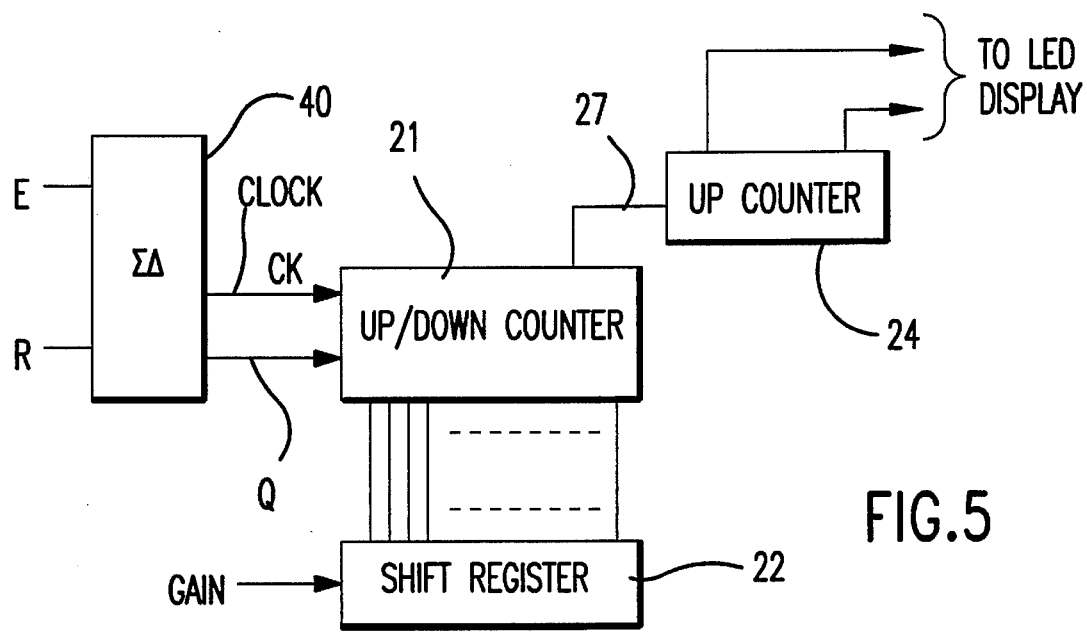
FIG. 5 shows a metering device including a single sigma-delta circuit and a variable digital gain according to a third embodiment of the invention.

FIG. 5 is a third embodiment of the invention that is similar to the first embodiment of FIG. 3, but includes a single sigma-delta converter 40 as opposed to the combined sigma-delta converter 20 of FIG. 3. Based on input signal E and reference signal R, the sigma-delta converter 40 generates an output signal Q including positive and negative pulses. The output signal Q and the clock signal CK are provided to the up/down counter 21. The up/down counter 21, the register 22 and the up counter 24 are structured and function similarly to the like-numbered elements in FIG. 3.

Figure 6:
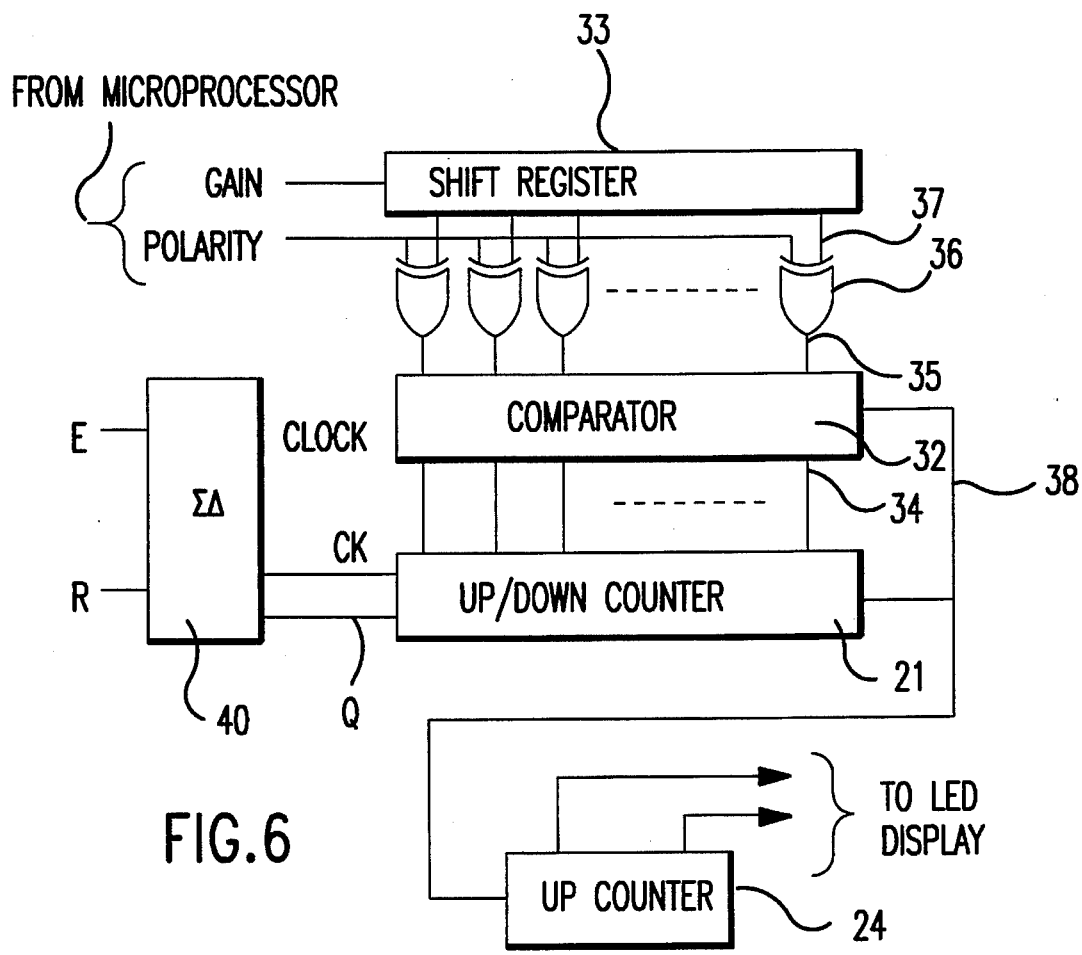
FIG. 6 shows a metering device including a single sigma-delta circuit and variable digital gain according to a fourth embodiment of the invention.

The fourth embodiment of FIG. 6 is similar to the second embodiment of FIG. 4 except that the combined sigma-delta converter 20 of FIG. 4 has been replaced with the single sigma-delta converter 40 in FIG. 6. The single sigma-delta converter 40 receives input signal E and reference signal R and generates output signal Q with positive and negative pulses, based on the input signal E and the reference signal R. The output signal Q is provided to the up/down counter 21 along with the clock signal CK. The up/down counter 21, the lines 341 the comparator 32, the shift register 33, the lines 37, the exclusive or gates 36, the line 38 and the up counter 24 in FIG. 6, are structured and function similarly to the like-numbered elements of FIG. 4.

We claim:

1. An electricity metering device comprising:

means for measuring voltage and current at a predetermined location and including at least one sigma-delta converter adapted to output a series of digital pulses representative of consumed power, said power being the product of the measured voltage and current;

a digital counter means for summing the output of the sigma-delta converter;

a signalling means to deliver an output signal when the sum reaches a predetermined value; and a means for digitally adjusting the gain of the sigma-delta converter including:

a programmable digital memory means adapted to store a parameter representing the gain of the metering device, the value of the parameter being externally programmable; and a digital logic means for logically combining the gain parameter with the digital sum stored in the counter means to determine the number of pulses required before the predetermined value is reached and an output pulse delivered by the signalling means.

2. An electricity metering device as claimed in claim 1, wherein the counter means and signalling means include a counter adapted to generate an output signal when the counter reaches a fixed predetermined value; and wherein the gain parameter is a numerical value added by the logic means to the output signal of the counter which counts based on the pulses from the sigma-delta converter.

3. An electricity metering device as claimed in claim 2, wherein the output signal from the counter is fed to an additional counter means to control a meter output display based on the number of output signals counted.

4. An electricity metering device as claimed in claim 1, wherein the logic means and signalling means include a comparator adapted to compare the value of the gain parameter with the value of the sum in the counter means and to deliver an output signal when the two values are equal.

5. An electricity metering device as claimed in claim 4, wherein the counter means includes a binary up-down counter, and further comprising:

means connected between the comparator and the memory means, for supplying the binary complement of the gain parameter to the comparator for compensating for the polarity of the pulses output from the sigma-delta converter.

6. An electricity metering device as claimed in claim 5, wherein the output signal from the comparator is fed to an additional counter means to control a meter output display based on the number of output signals counted.

7. An electricity metering device as claimed in claim 6, comprising a plurality of sigma-delta converters, the gain of each converter being adjustable by means of an associated programmable memory means and logic means.

8. An electricity metering device as claimed in claim 7, comprising a combination of sigma-delta devices operating to give a value representative of the multiplication of input signals representing the current and voltage of a metered supply, the gain of the final sigma-delta of the combination which produces an output representative of the energy or power of the metered supply being adjustable by means of an associated programmable memory means and logic means.

9. An apparatus receiving an input signal and a reference signal, comprising:

a sigma-delta converter coupled to receive the input signal and the reference signal, and generating an output signal with positive and negative pulses;

an up/down counter coupled to receive the output of the sigma-delta converter for receiving a predetermined gain value, and for counting up or down starting from the predetermined gain value based on the positive or negative pulses, respectively, of the output signal from the sigma-delta converter, and for generating an output signal when the up/down counter reaches a predetermined count value;

a register coupled to the up/down counter, for storing the predetermined gain value and supplying the predetermined gain value to the up/down counter before the up/down counter begins counting the positive and negative pulses in the output signal from the sigma-delta converter.

10. An apparatus as claimed in claim 9, further comprising:

an up counter coupled to receive the output signal from the up/down counter, and generating an output indicative of the level of the input signal.

11. An apparatus receiving an input signal and a reference signal, comprising:

a sigma-delta converter coupled to receive the input signal and the reference signal, generating an output signal including positive and negative pulses, based on the input signal and the reference signal;

an up/down counter coupled to the sigma-delta converter to receive the output signal, the up/down counter counting up or down based on positive or negative pulses, respectively, and generating an output signal based on the positive and negative pulses of the output signal from the sigma-delta converter; and a comparator coupled to receive the output from the up/down counter, the comparator receiving a predetermined gain for comparison with the output signal from the up/down counter, and generating an output signal which is activated when the output signal from the up/down counter equals the predetermined gain.

12. An apparatus as claimed in claim 11, further comprising:

a register storing the predetermined gain, the register having an output coupled to the comparator to provide the predetermined gain thereto.

13. An apparatus as claimed in claim 12, wherein the apparatus receives a polarity signal, the apparatus further comprising:

a plurality of exclusive or gates coupled between the register and the comparator, each exclusive or gate receiving a bit of the predetermined gain and the polarity signal as inputs, the plurality of exclusive or gates outputting one of the predetermined gain and a complement of the predetermined gain, to the comparator, based on the polarity signal.

14. An apparatus as claimed in claim 11, further comprising:

an up counter coupled to receive the output of the comparator, for counting a number of activations of the output signal generated by the comparator.

15. An apparatus as claimed in claim 14, wherein the output of the comparator is coupled to the up/down counter to clear the up/down counter when the output signal from the comparator is activated.

* * * * *